(12) United States Patent  (10) Patent No.: US 8,941,013 B2
Arnold  (45) Date of Patent: Jan. 27, 2015

(54) MULTILAYER LAMINATED STRUCTURE FOR PLUG AND CONNECTOR WITH SPRING FINGER INTERCONNECTING FEATURE

(76) Inventor: Shawn X. Arnold, San Jose, CA (US)

( * ) Notice: Subject to any disclaimer, the term of this patent is extended or adjusted under 35 U.S.C. 154(b) by 0 days.

(21) Appl. No.: 13/598,503

(22) Filed: Aug. 29, 2012

(65) Prior Publication Data

US 2013/0319739 A1    Dec. 5, 2013

Related U.S. Application Data

(60) Provisional application No. 61/653,286, filed on May 30, 2012.

(51) Int. Cl.
    *H01R 13/62*      (2006.01)
    *H05K 1/16*      (2006.01)

(52) U.S. Cl.
    USPC .......................................................... 174/258

(58) Field of Classification Search
    USPC ............ 439/67, 633, 637, 660, 521; 361/762; 29/829
    See application file for complete search history.

(56) References Cited

U.S. PATENT DOCUMENTS

| | | | |
|---|---|---|---|
| 3,601,774 A * | 8/1971 | Stathos et al. | 439/637 |
| 3,614,714 A * | 10/1971 | Silverstein | 439/633 |
| 5,219,292 A * | 6/1993 | Dickirson et al. | 439/67 |
| 5,376,019 A * | 12/1994 | Shimirak et al. | 439/521 |
| 5,466,545 A * | 11/1995 | Chamberlain et al. | 429/99 |
| 6,817,002 B2 | 11/2004 | Larsen | |
| 7,021,971 B2 * | 4/2006 | Chou et al. | 439/660 |
| 7,232,315 B2 * | 6/2007 | Uchida et al. | 439/67 |
| 7,246,434 B1 | 7/2007 | Taylor et al. | |
| 7,601,919 B2 | 10/2009 | Phan et al. | |
| 7,944,707 B2 * | 5/2011 | Hung et al. | 361/762 |

(Continued)

FOREIGN PATENT DOCUMENTS

| | | |
|---|---|---|
| JP | 2001-307831 | 11/2001 |
| JP | 2002-232112 | 8/2002 |

(Continued)

OTHER PUBLICATIONS

PCT Application No. PCT/US2013/040596—International Search Report and Written Opinion dated Aug. 26, 2013.

*Primary Examiner* — Timothy Thompson
*Assistant Examiner* — Michael F McAllister
(74) *Attorney, Agent, or Firm* — Womble Carlyle Sandridge & Rice LLP (57) ABSTRACT

A spring finger interconnection system can include a plug and a receptacle. In one embodiment, the plug can include spring finger contacts configured to carry electrical signals. The receptacle can include a cavity to receive the plug and the cavity can be constructed with printed circuit board fabrication techniques. In one embodiment, the cavity can be formed, at least in part, in a pre-impregnation layer and a first and a second layer can be disposed above and below the pre-impregnation layer to further form the cavity. In one embodiment, contacts can be arranged on the first layer to contact the spring fingers when the plug is inserted into the cavity. In another embodiment, contacts can be arranged on both the first and the second layers. In yet another embodiment, the cavity can be shaped to aid in contact-to-spring finger alignment when the plug is inserted in the cavity.

23 Claims, 8 Drawing Sheets

(56) References Cited

U.S. PATENT DOCUMENTS

| | | | |
|---|---|---|---|
| 2001/0034156 A1 | 10/2001 | Yamane | |
| 2008/0047135 A1* | 2/2008 | Arnold | 29/829 |
| 2008/0311801 A1 | 12/2008 | Chen et al. | |
| 2011/0157842 A1 | 6/2011 | Bois et al. | |
| 2012/0050125 A1 | 3/2012 | Leiba et al. | |

FOREIGN PATENT DOCUMENTS

| | | |
|---|---|---|
| KR | 20-1990-0016230 | 9/1990 |
| KR | 10-2009-0132337 | 12/2009 |

* cited by examiner

MULTILAYER LAMINATED STRUCTURE FOR PLUG AND CONNECTOR WITH SPRING FINGER INTERCONNECTING FEATURE

CROSS REFERENCE TO RELATED APPLICATIONS

This application claims priority to U.S. Provisional Patent Application No. 61/653,286, filed May 30, 2012, entitled "SPRING FINGER INTERCONNECT," which is incorporated herein by reference in its entirety and for all purposes.

FIELD OF THE DESCRIBED EMBODIMENTS

The described embodiments relate generally to electrical connector systems, and more particularly to connector systems employing spring fingers.

BACKGROUND

Connector systems have long been used to couple electrical signals between devices, components, sub-systems and the like. In some cases, the cost per pin of some standard, off-the-shelf connectors can be relatively expensive, especially compared to the cost of other elements of a design such as electrical or electronic component costs or printed circuit board costs. Also, the design constraints of a standard connector can be relatively restrictive and may restrict the design choices available to a product designer. Pin counts, physical volumes needed to support connectors, and required back shell designs can be just a few connector design constraints placed upon the product designer.

One alternative to standard connectors are custom connectors designed specifically for a particular implementation. The physical attributes of the custom connector can be tuned to fit precisely into a product application in terms of physical size, appearance and number of supported circuits. Custom connectors are not without drawbacks, however. First of all, custom connectors usually have a substantial set up fee related to the design of the mold, back shell, contacts and other components. Secondly, the lead time for a custom connector can be substantial. Connector design and manufacture can require several months before a prototype is produced and made available. Yet another drawback of a custom connector is a lack of design flexibility. If the designer desires to change the connector by adding a circuit, for example, the design process begins again, accruing costs and perhaps more importantly adding to the overall design time of the product. Thus, although a custom connector can address some of the shortcomings of a standard connector, custom connectors can have other disadvantages that can make them an inferior design choice.

Therefore, what is needed is a low cost connector system with design flexibility and a relatively small design and fabrication cycle.

SUMMARY OF THE DESCRIBED EMBODIMENTS

This paper describes various embodiments that relate to a two part connector system including a plug with spring finger contacts and a receptacle, configured to receive the plug.

One embodiment of a receptacle for a connector system can include a pre-impregnation layer with a first and second layer disposed below and above the pre-impregnation layer and in direct contact with the pre-impregnation layer. The first and second layers in combination with the pre-impregnation layer can form a cavity for the connector receptacle. Contacts for the connector can be arranged on one of the layers. In one embodiment, contacts can be arranged on both first and second layers.

A method for forming a connector receptacle can include the steps of arranging circuit contacts on a first layer, determining a cavity shape, forming at least a portion of the cavity in a pre-impregnation layer and bonding the first and a second layer to the pre-impregnation layer.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Connector systems are important components of most electrical product designs. Connector systems can support the connection of different articles such as a headphone to a media player, or can support the coupling of different internal pieces within a system, such as a display screen to a laptop motherboard.

Although the usage of connector systems is pervasive, connector systems can include drawbacks that can make them difficult to design with. Connector systems are often relatively expensive, especially when compared to other components or parts of a design. Secondly, standard, off-the-shelf connectors can have limited choices regarding the number of circuits supported and physical space requirements. Although the choices can be varied, the optimal choice for a particular design may not be readily available.

Custom connectors can be designed for any application, but the lead time for such connectors can sometimes be several weeks before a prototype is available, and a few more weeks before manufacturing can be ramped up for production quantities. Furthermore, if any design changes need to be made to the connector, additional time can be required before another prototype can be produced.

One embodiment of a spring finger interconnection system can include a connector and a receptacle. The connector can include low profile, metallic contacts that can be disposed on at least one surface of the connectors. In one embodiment, the metallic contacts can be disposed on a supporting substrate such as a printed circuit board (PCB), flexible printed circuit board (flex cable), rigid flex cable or any other technically feasible support. In one embodiment, the receptacle can be disposed on a PCB. In one embodiment, the receptacle can include a cavity disposed on one edge of a PCB. Connector contacts can be configured on at least one surface of the cavity and can be formed from at least one layer of the PCB. Both the contacts on the plug and the receptacle can be formed with standard PCB manufacturing techniques. Thus, modifications to connector style or count can be accomplished relatively quickly compared to the amount of time required to change the design of a full custom connector. Also, because of the reliance on PCB manufacturing techniques, the cost per supported circuit of the spring finger interconnection system can be relatively low with respect to both standard and custom connector systems.

Figure 1A:
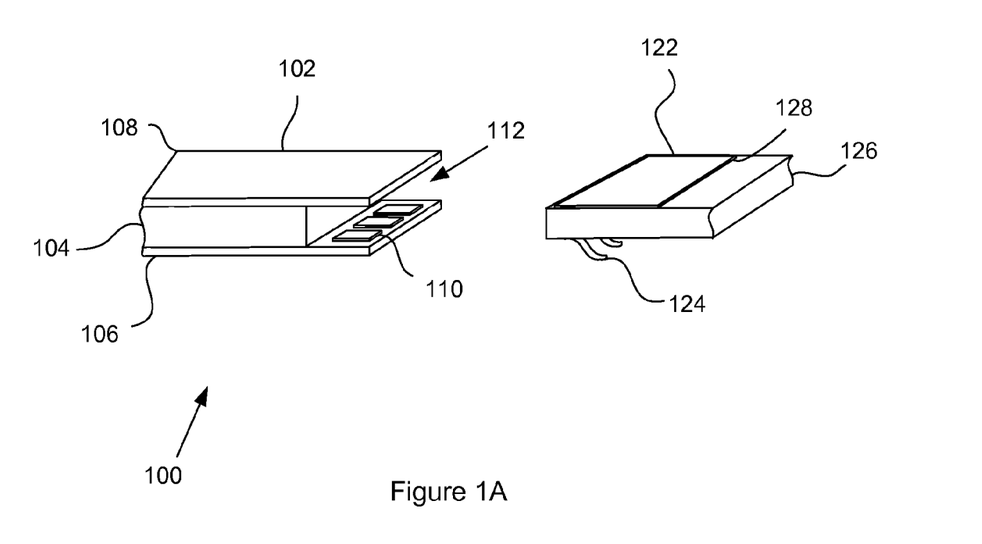
FIG. 1A shows one embodiment of a spring finger connection system.

FIG. 1A shows one embodiment of a spring finger connection system 100. The connection system can include a plug 122 and a receptacle 102. The system illustrated in FIG. 1A has been simplified by removing some elements of the connection system 100 and is not meant to be limiting. FIG. 1A shows cross sectional details of the connection system 100; the connection system 100 can be part of a larger design as is described in FIG. 3 below. Although shown as a rectangle, plug 122 and receptacle 102 can be any feasible shape. Plug 122 can include spring fingers 124 configured as contacts disposed on one side of a substrate 126. In one embodiment, spring fingers 124 can be formed from metals such as copper, beryllium-copper or any other suitable metallic conductor. Although only one row of spring fingers 124 is shown here, any number of spring fingers can be used configured in any number of rows and columns, the number spring fingers 124 being commensurate with available area for the connection system 100. Substrate 126 can be a flexible cable (flex cable), PCB, rigid flex or similar substance. In some embodiments, plug 122 can include a rigid backer 128 to provide additional stiffness to the area near spring fingers 124.

Receptacle 102 can be disposed on one edge of a PCB. Receptacle 102 can include a pre-impregnated (prepreg) layer 104 sandwiched between a first layer 106 and a second layer 108. In one embodiment, the first layer 106 can be a conductor layer and can receive a metal foil such as copper. In another embodiment, first layer 106 and second layer 108 can be PCB copper clad layers. In this exemplary embodiment, contacts 110 can be disposed on the first layer 106 configured to align with and mate to spring fingers 124 on plug 122. Contacts 110 can be plated with additional conductive materials such as tin or gold. In one embodiment, a cavity 112 can be formed between first layer 106 and second layer 108, thereby forming a receiving area for plug 122. The separation between first and second layers 106 and 108 respectively provided by prepreg 104 can be configured to match the amount of height required by plug 122. In one embodiment, the number of spring fingers 124 and contacts 110 can be adapted to fit within the receiving area for plug 122. For example, the receiving area can extend into prepreg 104 such that two or more rows of contacts 110 and spring fingers 124 can be supported.

Figure 1B:
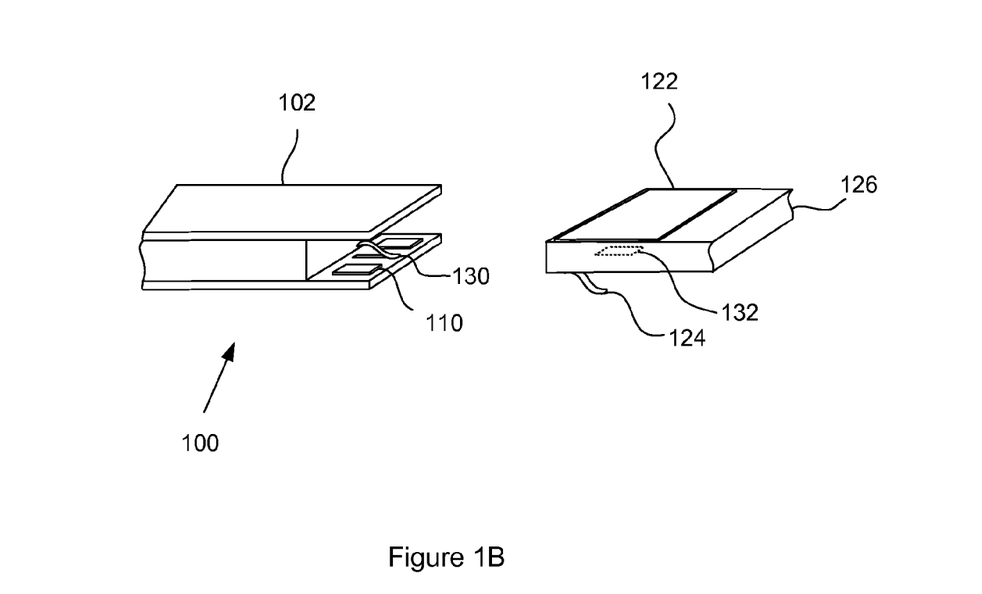
FIG. 1B shows another embodiment of a connection system with spring fingers on both the plug and receptacle sides.

FIG. 1B shows another embodiment of spring finger connection system 100. Spring finger 130 can be included in receptacle 102 and corresponding contact pad 132 can be included in plug 122 on the bottom of substrate 126. The system illustrated in FIG. 1B has been simplified by removing some elements of the connection system 100 and is not meant to be limiting. In other embodiments, all of contact pads 110 on receptacle 102 can be replaced by spring fingers 130 and all of spring fingers 124 on plug 122 can be replaced by contacts 132. In yet another embodiment, any combination of spring fingers and contacts can be intermixed in both receptacle 102 and plug 122.

Figure 2:
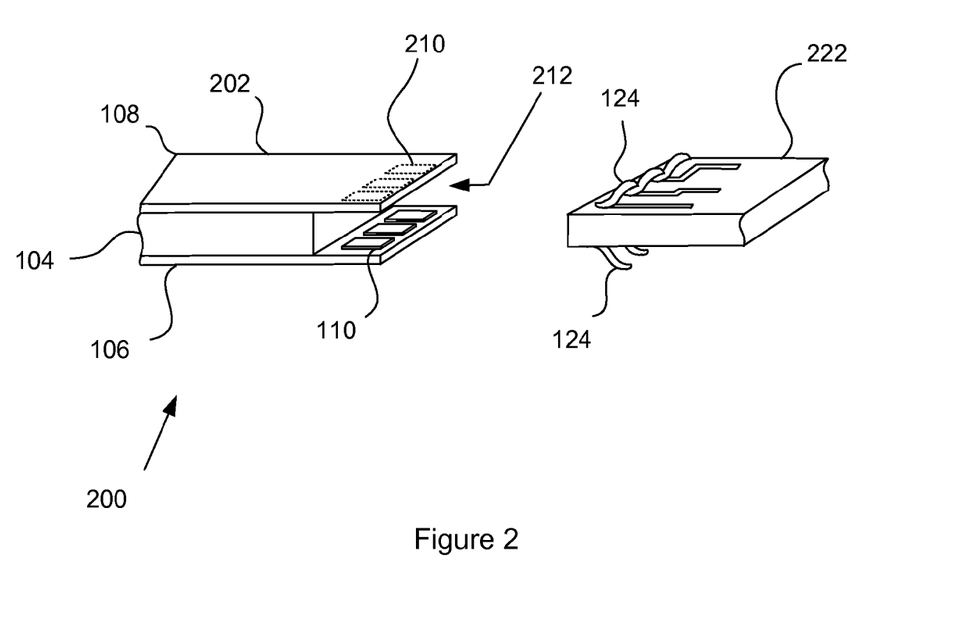
FIG. 2 shows another embodiment of a connection system with spring fingers on both the upper and lower sides of a plug.

FIG. 2 shows another embodiment of a spring finger connection system 200. Connection system 200 can include plug 222 and receptacle 202. Plug 222 can include spring fingers 124 disposed on opposing sides. Receptacle 202 can include prepreg 104 and first and second layers 106 and 108 respectively. Cavity 212 can be formed between first and second layers 106 and 108. Furthermore, cavity 212 can be configured to receive plug 222. In one embodiment, contacts 110 can be disposed on the first layer 106 and contacts 210 can be disposed on second layer 108. In one embodiment first layer 106 and second layer 108 can include copper clad PCB layers. The separation between first layer 106 and second layer 108 provided by prepreg 104 can be configured to match the dimensions of plug 222. The embodiment of FIG. 2 can add additional circuits to connection system 200 with respect to the embodiment shown in FIG. 1, in some cases doubling the amount of available circuits for transmitting or receiving electrical signals.

Figure 3:
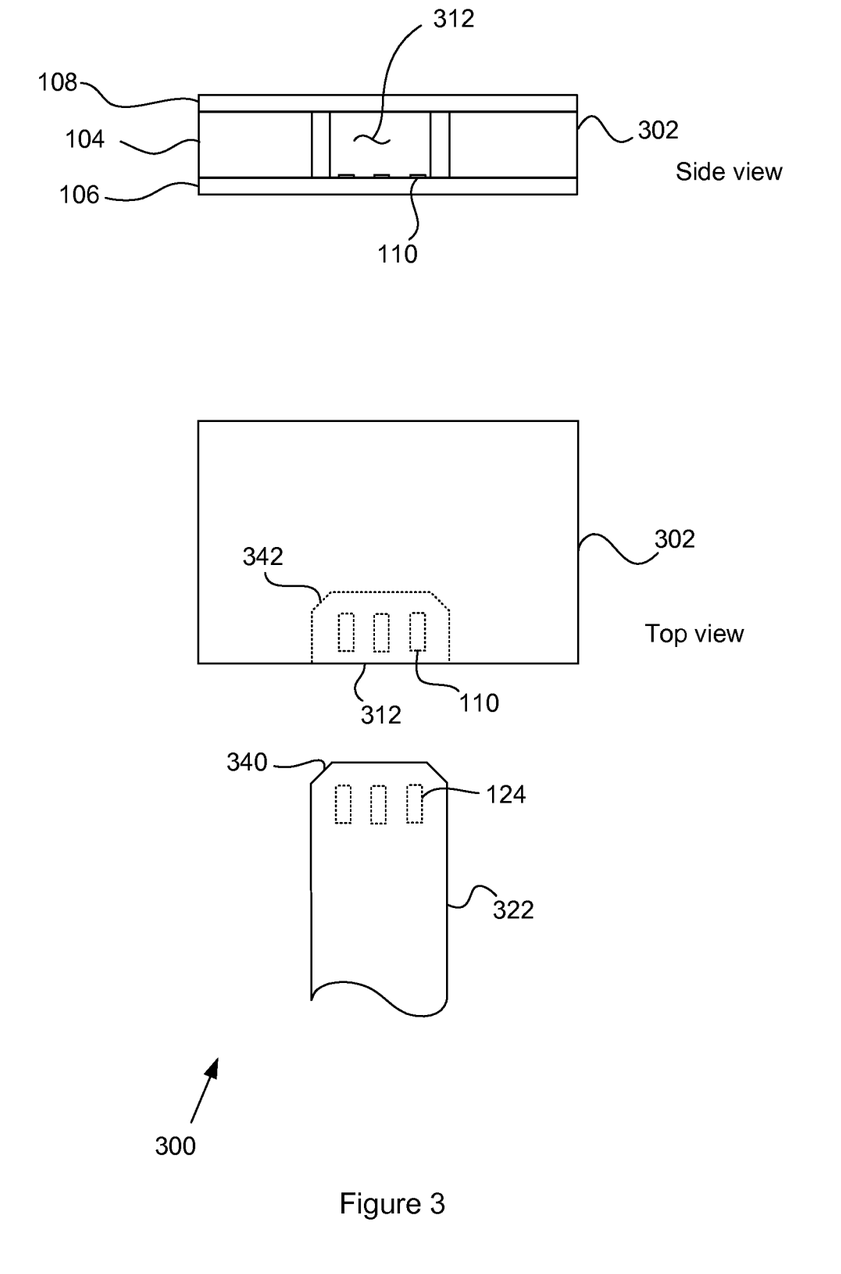
FIG. 3 shows top and side views of another embodiment of a spring finger connection system illustrating a possible shape for the receptacle and corresponding plug.

FIG. 3 shows top and side views of another embodiment of a spring finger connection system 300. Connection system 300 can include plug 322 and receptacle 302. Receptacle 302 can include cavity 312 disposed within receptacle 302 such that two opposing sides of cavity 312 can be formed by first layer 106 and second layer 108. Two other opposing sides of cavity 312 can be formed by prepreg 104. Contacts 110 (shown as dashed lines in the top view) can be disposed within cavity 312 (also shown as dashed lines in the top view). In one embodiment, contacts can be formed on first layer 106. In yet another embodiment, the height, width and depth of cavity 312 can be arranged to correspond with dimensions of plug 322 and also take into account any adjustments that can be made to accommodate clearances required for spring fingers 124. As shown in FIG. 3, spring fingers 124 (dashed lines) can be disposed on one side of plug 124 and configured to align with contacts 110 when plug 322 is fully inserted into cavity 312. In other embodiments, spring fingers 124 can be disposed on more than one surface of plug 322 and corresponding contacts 110 can be added to cavity 312 to align with additional spring fingers 124.

In one embodiment, plug 322 can include shaped edges 340. A corresponding shaped cavity edge 342 can be formed within cavity 312. Shaped edges 340 and shaped cavity edge 342 can assist in the alignment between plug 322 and receptacle 302. In FIG. 3, shaped edge 340 is shown as a chamfer and the shaped edge 340 is applied to more than one side of plug. In other embodiments, shaped edge 340 can be applied to a single side of plug 322. Although shaped edge 340 is shown as a chamfer, any other shape can be used.

Figure 4:
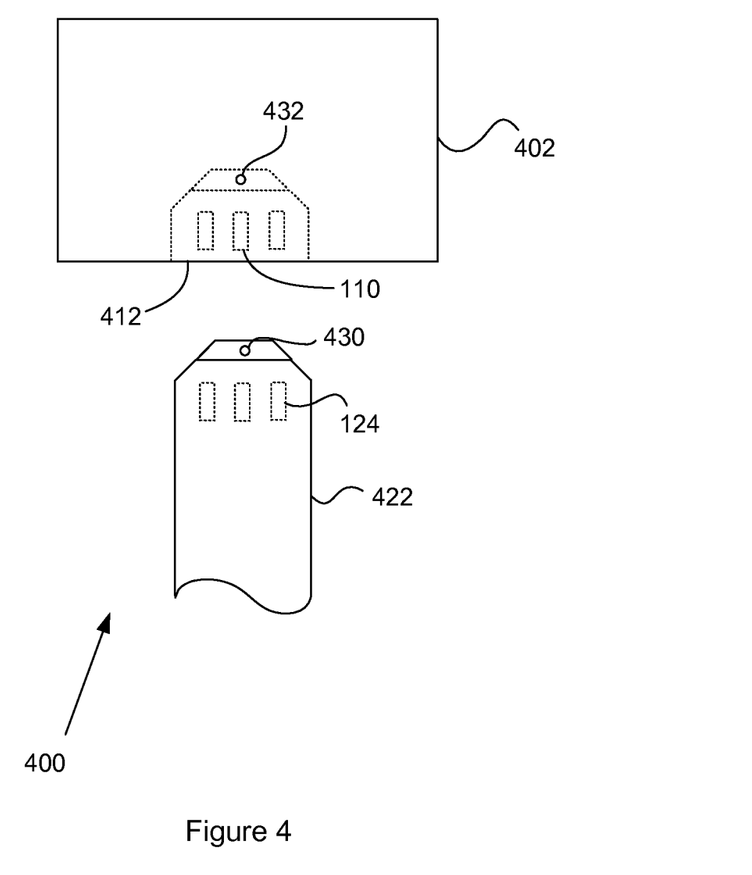
FIG. 4 is a top view of yet another embodiment of a spring finger connection system incorporating a locking feature.

FIG. 4 is a top view of yet another embodiment of a spring finger connection system 400. Plug 422 can include spring fingers 124. In addition, receptacle 402 can include a cavity 412 corresponding in shape to plug 422 and include contacts 110 configured to align with spring fingers 124 when plug 422 is inserted into cavity 412. Plug 422 can include a locking hole 430 and receptacle 402 can include a corresponding locking hole 432. In one embodiment, when plug 422 is inserted into cavity 412, a locking pin can be inserted through locking holes 430 and 432 and act as a retention mechanism for plug 422. In another embodiment, a dip adhesive can be applied to plug 422 to act as a retention mechanism. In yet another embodiment, an adhesive can be applied to cavity 412. If an adhesive is applied to cavity 412, the adhesive can also act as a protective coating for contacts 110. In still another embodiment, an epoxy can be applied to either plug 422 or cavity 412 to aid in retention. Locking holes, adhesives and epoxies can be used separately or in combination as a retention aid.

Figure 5:
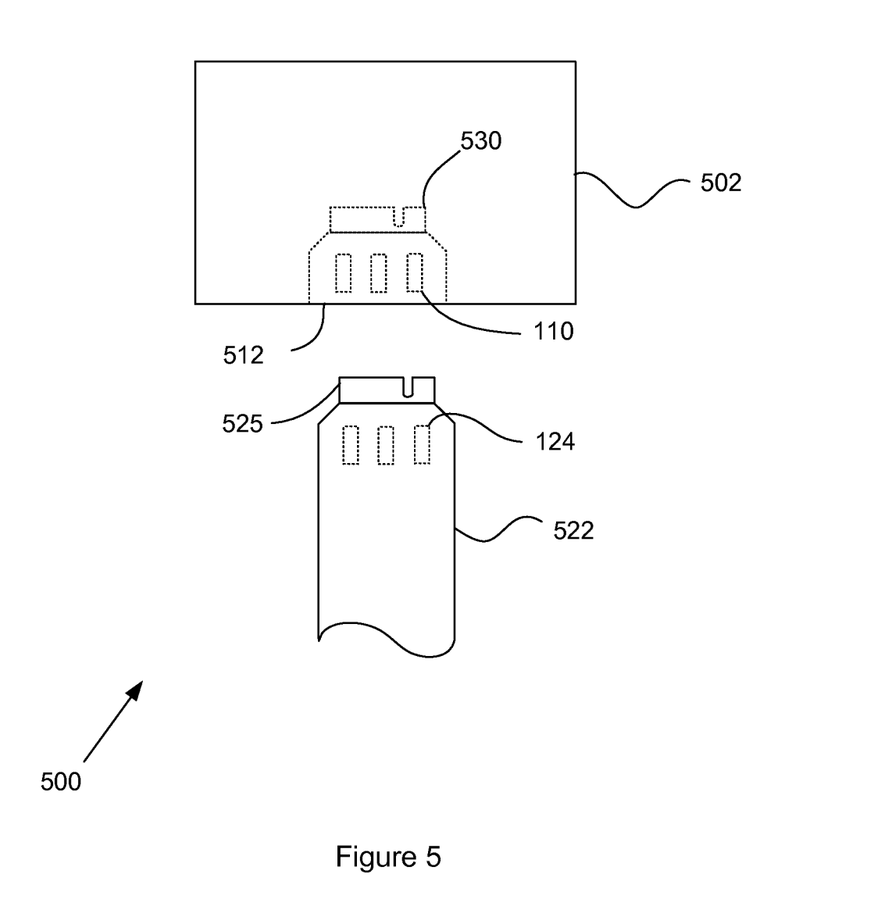
FIG. 5 is a top view of still another embodiment of a spring finger connection system incorporating an alignment feature.

FIG. 5 is a top view of still another embodiment of a spring finger connection system 500. Plug 522 can include spring fingers 124 and key 525. Receptacle 502 can include cavity 512, contacts 110 and key receiver 530. In one embodiment key 525 and receiver 530 can be configured to help prevent incorrect insertion of plug 522 into cavity 512. Key 525 and key receiver 530 can also help align contacts 110 with spring fingers 124. Key 525 and key receiver 530 can be used separately or in combination with shaped edges 340.

Figure 6:
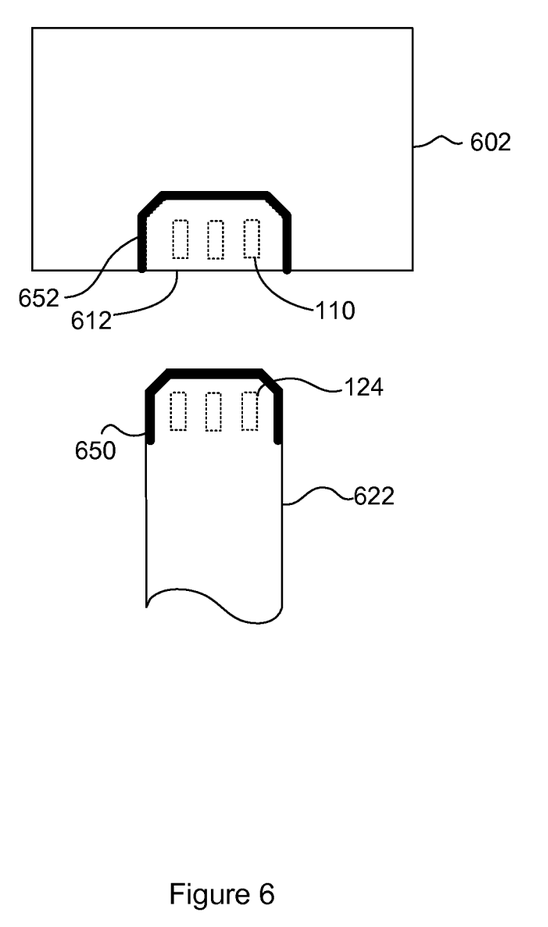
FIG. 6 is a top view of still yet another embodiment of a spring finger connection system showing how a metal edge can be added to allow for precision trimming of the receptacle and plug.

FIG. 6 is a top view of still yet another embodiment of a spring finger connection system 600. Connection system 600 can include plug 622 and receptacle 602. Plug 622 can include spring fingers 124 and metal edge 650. In one embodiment, metal edge 650 can be formed by selectively plating copper or other suitable metal to the edge of plug 622. Metal edge 650 can be precision trimmed to aid in precise alignment of spring fingers 124 to contacts 110 in receptacle 602. In one embodiment, metal edge 650 can be trimmed by a laser or any other technically feasible method. Receptacle 602 can include a cavity 612. Cavity 612 can include metal edge 652 that can be precision trimmed to aid in improving the alignment of spring fingers 124 with contacts 110. In one embodiment, metal edge 652 can be formed by selectively plating copper or other suitable metal to edge areas of cavity 612.

Figure 7:
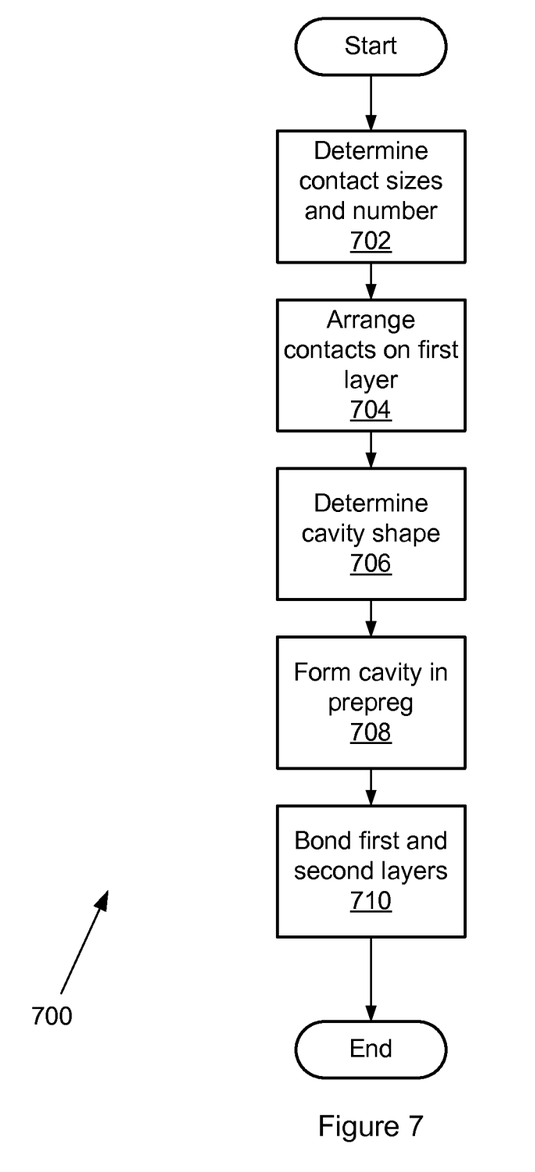
FIG. 7 is a flow chart of method steps for forming a receptacle in accordance with one embodiment of the specification.

FIG. 7 is a flow chart of method steps 700 for forming a receptacle in accordance with one embodiment of the specification. Persons skilled in the art will appreciate that any system executing the following steps in any order is within the scope of the disclosed method steps. The method begins in step 702 where contact sizes and numbers are determined. Contact size can be determined by an amount of area available for contacts as well as an intended circuit use. For example, small signals (analog) or digital signals may require relatively low amounts of current and therefore may only need a small amount of contact surface area to support the signal. On the other hand, power supply signals can have relatively larger amounts of current and can require relatively more contact surface area. In one embodiment, different contact sizes can be mixed within a particular connector system. In such a system, circuits requiring larger amounts of current can be sized accordingly, while signals requiring lesser amounts of current can be made smaller. Thus, the contact sizes and number can be selected in accordance with the number and type of circuits supported by the receptacle.

Next, in step 704, the contacts selected in step 702 can be arranged on a first layer. In one embodiment, the contact arrangement can be optimized to use area effectively. In step 706, a cavity shape within the receptacle can be determined. The cavity shape can be determined in accordance with the area required to support a predetermined number of contacts. In one embodiment, the cavity shape can include edge shaping and/or a key receiver for aligning the cavity with a corresponding plug. In another embodiment, the cavity shape can include a locking feature such as a hole to aid in retention of the plug. In step 708 the cavity can be formed. In one embodiment, the cavity can be formed within the prepreg layer using standard PCB manufacturing techniques. In step 710 the first and a second layer can be bonded to the prepreg layer forming the cavity and completing the receptacle.

Figure 8:
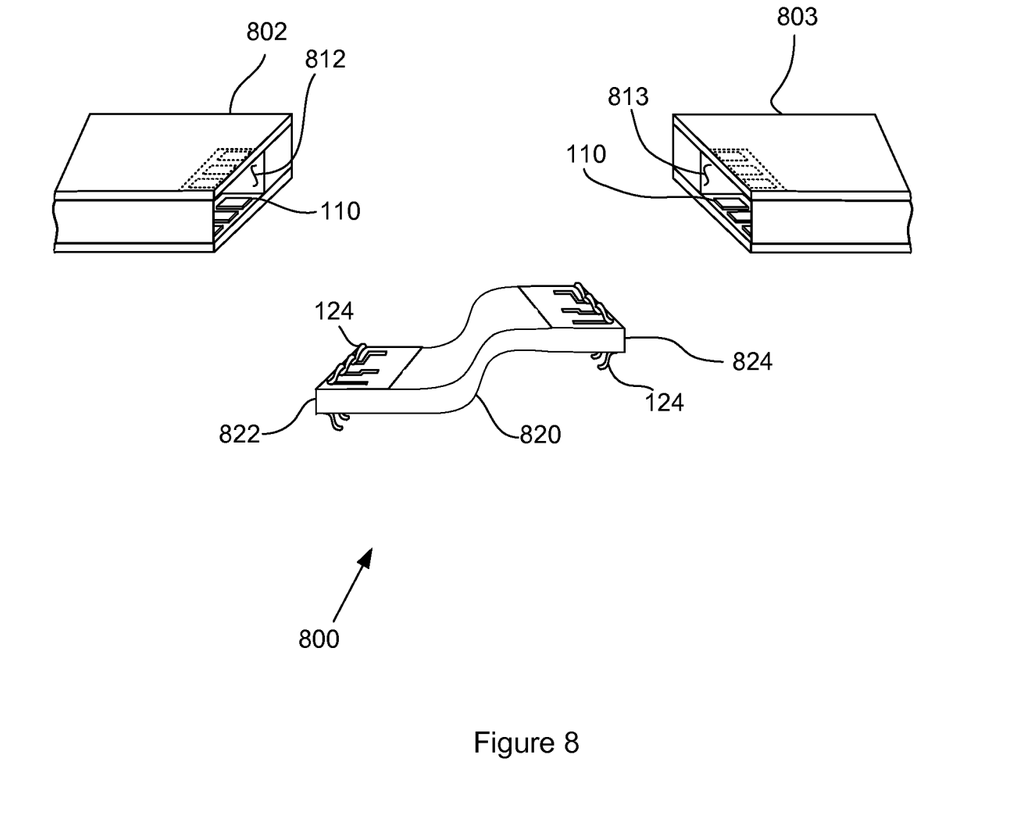
FIG. 8 illustrates another embodiment of a spring finger connection system allowing two components with receptacles to be connected by a plug assembly.

FIG. 8 illustrates another embodiment of a spring finger connection system 800. In this embodiment, a first receptacle 802 can be electrically coupled to a second receptacle 803 through plug assembly 820. First receptacle 802 and second receptacle 803 can be similar in composition to receptacle 202 shown in FIG. 2. First receptacle 802 can include first cavity 812. First cavity 812 can include one or more contacts 110. Similarly, second receptacle 803 can include second cavity 813. Second cavity 813 can include one or more contacts 110.

Plug assembly 820 can include first end 822 and second end 824. Both first end 822 and second end 824 can include spring fingers 124. In one embodiment, spring fingers 124 can be configured on top and bottom surfaces of plug assembly 820 and can align with contacts 110 in first cavity 812 and second cavity 813 such that when plug assembly 820 is inserted into cavities 812 and 813, electrical contact can be made between spring fingers 124 and contacts 110. In this way, signals on first receptacle 802 can be coupled to signals on second receptacle 803 through plug assembly 820.

Plug assembly 820 can be flex, rigid flex or any other technically feasible material. In one embodiment first receptacle 802 and second receptacle 803 can be composed of similar material (layer materials, copper thickness, prepreg material etc). In another embodiment, first receptacle 802 and second receptacle 803 can be composed of different materials. For example, first receptacle 802 can be a rigid PCB while second receptacle 803 can be a flexible PCB. In another example, first receptacle 802 can be a PCB including an FR-4 substrate while second receptacle 803 can be a PCB including a Nelco or Rogers substrate. In this way, plug assembly 820 can be used to couple dissimilar PCB technologies.

Although plug assembly 820 and first and second cavities 812 and 813 are shown here as including contacts 110 and spring fingers 124 on both top and bottom surfaces, other embodiments can include contacts 110 and spring fingers 124 on only one surface. In one embodiment, plug assembly 820 can be configured such that first end 822 has spring fingers 124 on the top surface while second end 824 has spring fingers 124 on the bottom surface. Similarly, contacts within first and second cavities 812 and 813 can be disposed on a single surface and configured to align with spring fingers 124 on first 822 and second 824 ends of plug assembly 820.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A connector receptacle suitable for receiving a connector plug, the connector receptacle comprising:
   a pre-impregnation (prepreg) layer;
   a first layer disposed below and in contact with the prepreg layer, the first layer comprising a conductive layer and a substrate layer, wherein the conductive layer is disposed between the substrate layer and the prepreg layer;
   a second layer disposed above and in contact with the prepreg layer;
   a cavity defined at least in part by a plurality of surfaces of the prepreg layer, the plurality of surfaces defining a tapered geometry shaped to mate with a corresponding geometry of the connector plug and to restrict movement of the connector plug along a plane parallel to the prepreg layer when the connector plug is engaged within the cavity;
   at least one contact disposed on the first layer and configured to transmit or receive electrical signals between the conductive layer and the connector plug when the connector plug is engaged within the cavity; and
   a metal plating layer disposed along the plurality of surfaces of the prepreg layer defining the tapered geometry, wherein the metal plating layer is configured to aid in aligning the at least one contact disposed on the first layer with at least one contact of the connector plug when the connector plug is engaged within the cavity.

2. The connector receptacle as recited in claim 1, wherein the second layer comprises a second substrate layer and a second conductive layer, wherein a portion of the second conductive layer is disposed between the second substrate layer and the prepreg layer.

3. The connector receptacle as recited in claim 2, further comprising at least one contact disposed on the second layer and configured to transmit or receive electrical signals between the second conductive layer and the connector plug when the connector plug is engaged within the cavity.

4. The connector receptacle as recited in claim 1, further comprising a locking feature that is configured to engage with a matching feature of the connector plug.

5. The connector receptacle as recited in claim 4, wherein:
   the locking feature of the connector receptacle includes a first hole having a dimension that corresponds with a dimension of a second hole of the connector plug; and
   the first hole and second hole are configured to receive a fastener for securing the connector plug with the connector receptacle when the connector plug is engaged within the cavity.

6. The connector receptacle as recited in claim 1, wherein a precision trimmed surface of the metal plating layer aids in aligning the at least one contact disposed on the first layer with the at least one contact of the connector plug when the connector plug is engaged within the cavity.

7. The connector receptacle as recited in claim 1, wherein the at least one contact of the connector plug comprises a spring finger.

8. The connector receptacle as recited in claim 7, wherein the at least one contact disposed on the first layer is a contact pad that is configured to communicate electrical signals between the conductive layer the spring finger of the connector plug when the connector plug is engaged within the cavity.

9. A method for forming a connector receptacle, the method comprising:
   arranging one or more contacts on a first layer, the first layer comprising a conductive layer and a substrate layer, wherein the one or more contacts are configured to communicate electrical signals between the conductive layer and a connector plug;
   forming a cavity along an edge of a pre-impregnation (prepreg) layer, the cavity being defined at least in part by a chamfered surface that is configured to be coupled with a chamfered edge of the connector plug;
   disposing a metal plating layer at least along the edge of the prepreg layer, wherein the metal plating layer is configured to aid in aligning the one or more contacts on the first layer with one or more contacts of the connector plug when the connector plug is engaged within the cavity;
   bonding the first layer to a first surface of the prepreg layer; and
   bonding a second layer to a second surface of the prepreg layer, wherein the second surface of the prepeg layer is positioned to oppose the first surface of the prepeg layer.

10. The method as recited in claim 9, wherein the second layer further comprises a second conductive layer and a second substrate layer, wherein the second conductive layer is disposed between the second substrate layer and the prepreg layer.

11. The method as recited in claim 10, further comprising arranging one or more contacts on the second layer, wherein the one or more contacts on the second layer are configured to communicate electrical signals between the second conductive layer and the connector plug.

12. The method as recited in claim 9, further comprising forming a locking feature at the connector receptacle, wherein the locking feature is configured to engage with a matching feature of the connector plug.

13. The method as recited in claim 12, wherein:
the locking feature formed at the connector receptacle includes a first hole having a dimension that corresponds with a dimension of a second hole of the connector plug; and
the first hole and the second hole are configured to receive a fastener for securing the connector plug with the connector receptacle when the connector plug is engaged within the cavity.

14. The method as recited in claim 9, further comprising trimming the metal plating layer to match a size and a shape of the connector plug.

15. The method as recited in claim 14, wherein the metal plating layer is precision-trimmed using a laser cutting device.

16. A system for establishing an electrical connection between multiple device components of the system, the system comprising:
a plug assembly having a first plug with at least one electrical contact and a second plug with at least one electrical contact, wherein the plug assembly is configured to transmit electrical signals between the at least one electrical contact of the first plug and the at least one electrical contact of the second plug;
a first connector component including a first connector receptacle; and
a second connector component including a second connector receptacle, wherein the first connector receptacle and second connector receptacle each comprise:
a pre-impregnation (prepreg) layer,
a first layer disposed along and in contact with a first surface of the prepreg layer, the first layer comprising a conductive layer and a substrate layer, wherein a portion of the conductive layer is disposed between the substrate layer and the prepreg layer,
a second layer disposed along and in contact with a second surface of the prepreg layer,
a cavity defined at least in part by a plurality of surfaces of the prepreg layer, the plurality of surfaces defining a chamfered geometry shaped to mate with a geometry of the first plug or the second plug of the plug assembly to restrict movement of the first plug or the second plug along a plane parallel to the prepreg layer when the first plug or the second plug of the plug assembly is engaged within the cavity,
at least one contact disposed on the first layer and configured to transmit or receive electrical signals between the conductive layer and the first plug or the second plug when the first plug or the second plug of the plug assembly is engages within the cavity, and
a metal plating layer disposed along the plurality of surfaces of the prepreg layer defining the chamfered geometry, wherein the metal plating layer is configured to aid in aligning the at least one contact disposed on the first layer and the at least one electrical contact of the first plug or the at least one electrical contact of the second plug when the first plug or the second plug of the plug assembly is engaged within the cavity.

17. The system as recited in claim 16, wherein the cavity in the prepreg layer of the first connector receptacle or the second connector receptacle includes a locking feature that is configured to engage with a matching feature of the first plug or the second plug of the plug assembly.

18. The system as recited in claim 17, wherein, the locking feature includes a first hole having a dimension that corresponds with a dimension of a second hole of the first plug or the second plug of the plug assembly; and the first hole and the second hole are configured to receive a fastener for securing the first plug or the second plug of the plug assembly with the first connector receptacle or the second connector receptacle when the first plug or the second plug of the plug assembly is engaged within the cavity.

19. A printed circuit board, comprising:
a dielectric substrate, having an edge portion defining a chamfered notch, the chamfered notch having at least one chamfered edge that causes a width of the chamfered notch to narrow as the chamfered notch extends into the dielectric substrate;
a first layer coupled with a top surface of the dielectric substrate and disposed above the chamfered notch, the first layer comprising a plurality of electrical contacts disposed along a bottom surface of the first layer;
a second layer coupled with a bottom surface of the dielectric substrate and disposed below the chamfered notch, wherein the first layer and the second layer are arranged relative to the chamfered notch of the dielectric substrate to define a cavity having a size and a shape corresponding to a mating portion of a communication connector, and
a metal plating layer disposed along a surface of the edge portion of the dielectric substrate that defines at least a portion of the chamfered notch, wherein the metal plating layer is configured to aid in aligning the plurality of electrical contacts disposed along a bottom surface of the first layer with one or more electrical contacts of the communication connector when the mating portion of the communication connector is engaged within the cavity.

20. The printed circuit board as recited in claim 19, wherein the plurality of electrical contacts disposed along the bottom surface of the first layer are electrically coupled with the one or more electrical contacts of the communication connector when the communication connector is inserted into the cavity.

21. The printed circuit board as recited in claim 20, wherein the plurality of electrical contacts disposed along the bottom surface of the first layer are electrically coupled with at least one electrical component of the printed circuit board.

22. The printed circuit board as recited in claim 19, wherein the second layer comprises a plurality of electrical contacts disposed along a top surface of the second layer.

23. The printed circuit board as recited in claim 19, wherein the chamfered notch is defined by a first width and a second width, the second width being substantially less than the first width, and wherein the plurality of electrical contacts disposed along the bottom surface of the first layer are disposed within an area corresponding to the first width.

* * * * *

UNITED STATES PATENT AND TRADEMARK OFFICE
CERTIFICATE OF CORRECTION

PATENT NO. : 8,941,013 B2  
APPLICATION NO. : 13/598503  
DATED : January 27, 2015  
INVENTOR(S) : Shawn X. Arnold

Page 1 of 1

It is certified that error appears in the above-identified patent and that said Letters Patent is hereby corrected as shown below:

In the Claims:

Column 8, line 29 "conductive layer the" should read --conductive layer and the--.
Column 10, line 29 "connector," should read --connector;--.
Column 10, line 35 "a bottom surface" should read --the bottom surface--.

Signed and Sealed this
Fifth Day of May, 2015

Michelle K. Lee
*Director of the United States Patent and Trademark Office*